(12) United States Patent
Schaefer et al.

(10) Patent No.: US 6,302,361 B1
(45) Date of Patent: Oct. 16, 2001

(54) SWITCH MOUNTING BRACKET

(75) Inventors: Roger E. Schaefer; Michael T. Collins, both of St. Louis, MO (US)

(73) Assignee: Emerson Electric Co., St. Louis, MO (US)

( * ) Notice: Subject to any disclaimer, the term of this patent is extended or adjusted under 35 U.S.C. 154(b) by 0 days.

(21) Appl. No.: 09/286,344

(22) Filed: Apr. 5, 1999

(51) Int. Cl.$^7$ .................................................. G12B 9/00
(52) U.S. Cl. ............................ 248/27.3; 248/229.26; 248/229.16; 200/296
(58) Field of Search ........................... 248/27.3, 300, 248/229.26, 229.16, 216.4; 200/296, 293, 294, 295

(56) References Cited

U.S. PATENT DOCUMENTS

| | | | |
|---|---|---|---|
| 1,569,864 | 1/1926 | Leppert . | |
| 2,223,673 | * 12/1940 | Catron et al. | 200/531 |
| 2,329,158 | * 9/1943 | Gill | 248/27.3 |
| 2,525,977 | * 10/1950 | Tinnerman | 362/455 |
| 2,703,662 | * 3/1955 | Meyer | 220/3.6 |
| 2,795,834 | * 6/1957 | Szoke | 248/113 |
| 2,798,271 | * 7/1957 | Flora | 248/500 |
| 3,200,227 | 8/1965 | Karch . | |
| 3,412,225 | 11/1968 | Rogers et al. . | |
| 3,866,868 | * 2/1975 | Fish et al. | 248/27 |
| 4,262,181 | * 4/1981 | Tufano et al. | 200/296 |
| 4,295,018 | 10/1981 | Borrelli . | |
| 4,297,668 | * 10/1981 | Place | 337/365 |
| 4,398,073 | * 8/1983 | Botz et al. | 200/295 |
| 4,705,241 | * 11/1987 | Sadao et al. | 248/27.03 |
| 5,343,006 | * 8/1994 | Moffett | 200/296 |
| 5,604,661 | * 2/1997 | Nagao | 361/643 |
| 5,636,731 | * 6/1997 | Schaefer | 200/293 |
| 5,791,456 | * 8/1998 | Schaefer | 200/293 |
| 6,127,639 | * 10/2000 | Greco et al. | 200/293 |

* cited by examiner

Primary Examiner—Leslie A. Braun
Assistant Examiner—Naschia S. Morrison
(74) Attorney, Agent, or Firm—Howell & Haferkamp LC

(57) ABSTRACT

A mounting bracket for an electric switch is constructed of a single metal piece and does not require separate fasteners for holding the electric switch on the bracket.

18 Claims, 3 Drawing Sheets

SWITCH MOUNTING BRACKET

BACKGROUND OF THE INVENTION (1) Field of the Invention

The present invention pertains to a mounting bracket for mounting an electric switch. In particular, the present invention pertains to a mounting bracket for an electric switch that is constructed of a single metal piece and does not require separate fasteners for holding the electric switch on the bracket.

(2) Description of the Related Art

Electric switches are used in many types of environments that require the switch be fixed stationary to a surface with an actuator of the switch being readily accessible. In some applications, for example in reset switches, the switch actuator is a push button that extends outwardly from a protective housing enclosure of the switch. In some applications, reset switches of this type are required to be securely mounted adjacent an opening in a wall of an enclosure, such as a junction box containing the switch or the casing of an electrical device with which the switch is associated. The switch actuator extends into the opening of the wall, but does not extend significantly beyond the exterior surface of the wall. This is a common environment of electric motor reset switches having actuator buttons that are manually depressed to reset circuit breakers of the electric motors.

Electric motor reset switches are usually mounted in a junction box that is mounted to the exterior of the motor, or are mounted against an interior surface of the motor shell or endshield. Whether mounted in a junction box or in the motor shell, the switches are positioned so that their push button actuators extend into openings in the junction box wall or the motor shell or endshield, but do not extend significantly beyond the opening. A flexible grommet is then inserted into the opening to seal the opening. The flexibility of the grommet still enables manual pressing of the reset switch actuator button by manually pressing the grommet inwardly into the opening.

Because the push button actuator of the reset switch does not extend significantly beyond the opening in the junction box or motor shell wall, it is necessary that the switch housing be securely mounted relative to the opening to prevent any movement of the switch away from the opening when the reset actuator is being pressed. Prior art switch mountings have employed brackets that receive the housing of the reset switch and position the actuator of the switch at a spaced distance from the shell or junction box opening so that the switch actuator does not extend a significant distance through the opening. Prior art switch mounting brackets 12 of this type are shown in FIGS. 1 and 2. FIG. 1 shows a switch mounted to a junction box wall and FIG. 2 shows a switch mounted inside a motor shell. However, the bracket 12 alone would not support the switch 14. With the bracket 12, screw 16 and nut 18 fasteners or self-tapping screws were needed to secure the switch to the bracket and in some situations, spacers 22 were needed to properly position the switch relative to the bracket 12 and the motor shell opening 24 or junction box opening 26. In addition, fasteners 30 were needed to hold the bracket 12 to the motor shell wall 28 or the junction box wall 32. An alternative method of attaching the protector bracket to the shell would be to weld it to the shell. The assembly of the switch to the bracket and the assembly of the bracket to the motor shell wall or junction box wall also required a significant amount of the assembler's time. In the least, it was necessary to attach the switch to the bracket with at least two screw and nut fasteners or similar types of fasteners and then attach the bracket to the motor shell wall or junction box wall by an additional set of screw and nut fasteners or by pop rivets or weldments. If it was necessary to employ spacers or washers to properly position the switch actuator relative to the opening in the motor shell wall or junction box wall, the time of assembly was further increased.

The specialized brackets and the associated hardware and the labor time involved in mounting the switches all contributed significantly to the overall expense of mounting the switches. In order to reduce this expense, it would be necessary to reduce the number of fasteners needed to mount the switch to the bracket, thereby reducing or eliminating the hardware expense and reducing the labor expense by reducing the time needed to attach the switch to the bracket.

SUMMARY OF THE INVENTION

The present invention overcomes disadvantages associated with prior art switch mounting brackets by providing a bracket having a specific configuration that holds a switch housing of an electric switch to the bracket without the need for additional fasteners such a screw and nut fasteners, pop rivets, weldments, etc. In its preferred embodiment, the bracket is inexpensively formed from a single strip of metal. In addition, when employed with a particular type of switch, the switch housing is easily and quickly snapped into the bracket with the bracket and switch housing held securely together solely by the bracket.

The switch employed with the bracket of the invention is a commercially available push button electric switch or could be an automatic reset protector/switch (without a manual reset button or actuator). The switch is protected in a phenolic resin switch housing. The switch housing has a cylindrical exterior surface with a circular face surface at the front of the switch housing and a circular rear surface at the rear of the switch housing. The push button actuator projects from the center of the face surface. Electric contacts project from the rear surface. A circular or annular collar extends completely around the switch housing at the perimeter of the face surface. The collar has an annular or circular engagement surface that is parallel with and spaced from the face surface of the switch housing.

In the preferred embodiment, the bracket is formed from a single resilient metal strip. The strip has several bends formed therein that gives the bracket a configuration that is capable of holding the switch to the bracket and provides the proper positioning of the switch actuator relative to the opening in a motor shell wall or junction box wall. The bracket is formed with a flat, rectangular support surface at its middle. The support surface is dimensioned large enough to extend across the face surface of the switch housing. The support surface also has an opening at its center (½" in diameter) positioned to accommodate the push button actuator of the switch housing when the face surface of the switch housing is positioned flush against the support surface.

A pair of legs are formed in the bracket at the opposite ends of the support surface. Each of the legs are the same and appear as mirror images of each other at the opposite ends of the bracket support surface.

Each leg is provided with a spacing section that extends from the support surface at generally a right angle relative to the support surface. The spacing sections space the support surface and the actuator of the switch supported on the support surface from the wall of the motor shell or junction box to which the bracket is to be attached. Therefore, the length or the extent to which the spacing section spaces the bracket support surface from the separate wall depends on the particular switch employed with the bracket and the extent to which the switch actuator projects or extends from the switch face surface.

At the ends of the leg spacing sections, the legs have base sections that extend outwardly away from each other. The base sections are generally parallel to each other and positioned in the same plane when the bracket is to be attached to a flat housing shell wall, an endshield or junction box wall. When the bracket is to be attached to a cylindrical motor shell wall, then the base sections of the legs are formed at a slight angle that follows the curvature of the interior of the motor shell wall. The base sections are also provided with holes for fasteners that will be used to hold the bracket to the motor shell wall, an endshield or junction box wall.

From the opposite ends of the bracket leg base sections, the legs are formed with spring sections that angle back toward each other. The angles formed between the spring sections and the base sections of the two legs give the legs their resilience. The spring sections of the legs can be manually displaced away from each other, but the resilience of the bracket causes the spring sections to return to their original positions. The spring sections extend from the base sections of the legs to positions adjacent the opposite ends of the bracket support surface where tabs are formed in each of the spring sections. The tabs are formed in the spring sections by cutting generally U-shaped slots in the spring sections and then bending the tabs inwardly toward each other from the slots formed. The tabs have distal edges that are positioned adjacent the opposite ends of the bracket support surface.

From the tab ends of the spring sections, each of the legs is formed with a flange that extends away from the bracket support surface. The flanges have outwardly turned ears formed at their distal ends. The ears provide easy access to the distal ends of the flanges by a person's fingers so that the flanges may be moved away from each other against the resilience of the leg spring sections in inserting a switch housing between the flanges and onto the bracket support surface.

In use of the bracket, the bracket is first mounted to the interior surface of a motor housing shell or a junction box. In mounting the bracket, the opening in the bracket support surface is aligned with an opening through the wall of the motor shell or junction box provided to accommodate the actuator of the switch. The base sections of the legs are then secured against the interior surface of the motor shell, endshield or junction box by fasteners such as screws, nuts, pop rivets, weldments or other equivalent types of fasteners.

With the bracket secured to the interior surface of the motor shell, endshield or junction box, the ears at the ends of the leg flanges are then manually moved away from each other against the bias of the leg spring sections. This expands a spacing between the pair of flanges and causes the tabs and, in particular, the tab edges to move a slight distance away from the support surface of the bracket.

The switch housing is then inserted between the flanges as the assembler continues to hold the flanges in their displaced positions against the bias of the leg spring sections. The switch housing is positioned so that the switch actuator passes through the support surface opening and into the opening of the motor shell wall or junction box wall for manually reset protectors/switches, and so that the face surface of the switch housing is positioned flush against the bracket support surface. With the switch housing so positioned, the assembler then releases the ears of the leg flanges. The resilience of the leg spring sections then moves the flanges toward each other and toward the opposite sides of the switch housing and causes the tab edges to engage against the engagement surface of the switch housing collar. The resilience of the leg spring sections and the engagement of the tab edges against the engagement surface of the switch housing holds the switch housing securely to the bracket with the face surface of the switch housing flush against the support surface of the bracket. The resilience of the leg spring sections and engagement of the tab edges against the engagement surface of the switch housing alone holds the switch housing to the bracket and no additional fasteners are needed.

The construction of the switch mounting bracket and the particular switch housing with which it is intended for use provides an inexpensively manufactured switch mounting bracket. The bracket reduces the expense involved in assembling a switch to the bracket by removing the need for separate fasteners to hold the switch housing to the bracket. This also removes the expense of assembly time that would be needed in prior art switch mounting brackets that require separate fasteners for holding the switch housing to the bracket.

BRIEF DESCRIPTION OF THE DRAWINGS

Further objects and features of the present invention will be revealed in the following detailed description of the invention and in the drawing figures, wherein.

DESCRIPTION OF THE PREFERRED EMBODIMENT

Figure 8:
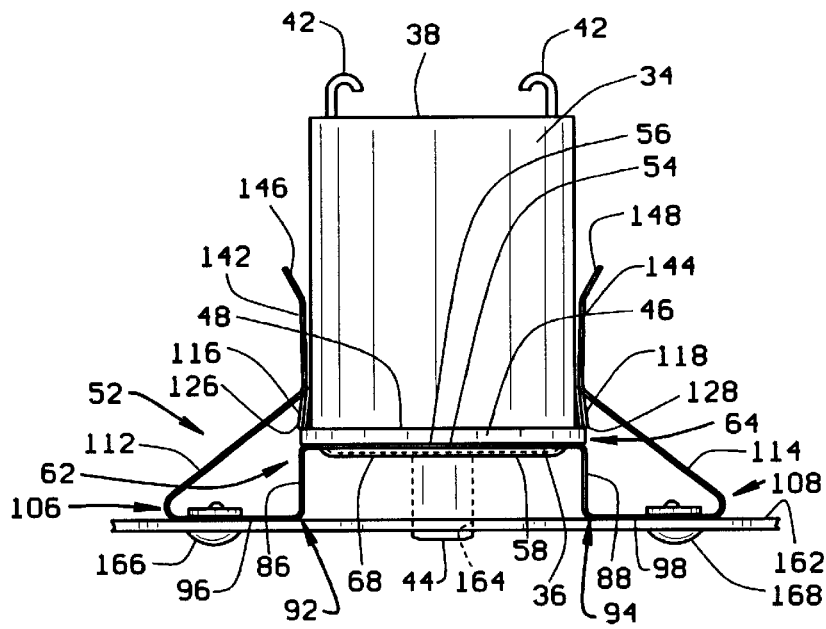
FIG. 8. is an elevation view of the switch mounting bracket of FIG. 3 showing it supporting a switch housing adjacent to an opening in a flat section of a wall.
Figure 9:
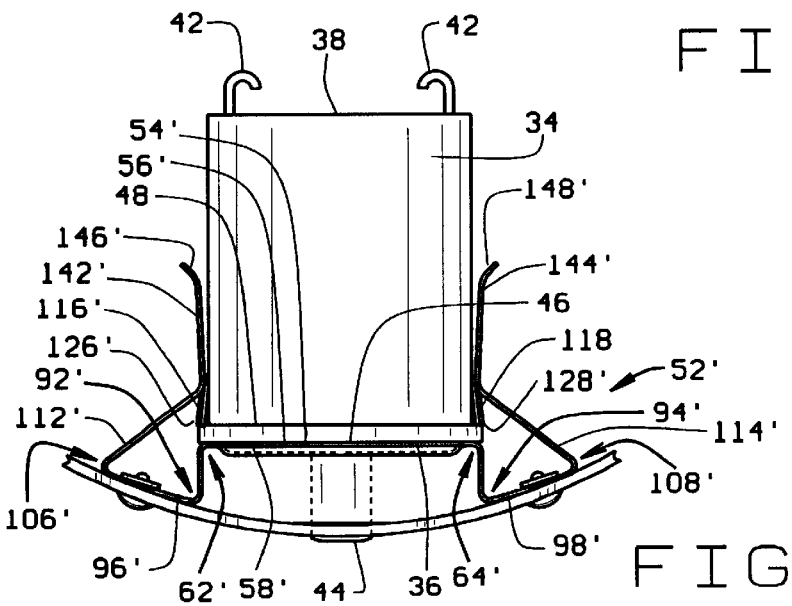
FIG. 9 is an elevation view of the switch mounting bracket of FIG. 7 showing it supporting a switch housing adjacent an opening in a curved or cylindrical section of a wall.

The switch mounting bracket of the invention was specifically designed for use with a particular switch as well as with other switches having similar features in their protective housing construction. The particular switch is shown in FIGS. 8 and 9. The switch has a protective switch housing that, in the preferred embodiment, is constructed of a phenolic resin. The particular switch is a commercially available push button electric switch. The switch housing 34 has a cylindrical exterior surface that extends between a circular face surface 36 at the front of the switch housing and a circular rear surface 38 at the rear of the switch housing. Electric contacts 42 project from the rear surface of the switch housing. A push button actuator 44 projects from the center of the switch housing face surface 36. The push button actuator 44 is spring biased and is shown in FIGS. 8 and 9 in its extended position relative to the switch housing. The actuator 44 may be manually depressed against the bias of its spring (not shown) toward the face surface 36 of the switch housing. The spring (not shown) returns the actuator 44 to its extended position shown in FIGS. 8 and 9 when the manual pressing force is removed.

The switch housing has a circular or annular collar 46 that extends completely around the cylindrical surface 34 of the switch housing adjacent the face surface 36 of the switch housing. The collar 46 has a larger diameter than the cylindrical surface 34 of the switch housing. This gives the collar an annular or circular engagement surface 48 that extends completely around the cylindrical surface 34 of the switch housing. The engagement surface 48 is positioned in a plane that is parallel with and spaced axially from the plane of the face surface 36 of the switch housing.

The extent to which the push button actuator 44 projects from the face surface 36 of the switch housing is important in the construction of the bracket to be described. When the bracket of the invention is employed with other types of switches, the extent to which an actuator, whether a push button actuator, a toggle actuator or other type of actuator, projects from the switch housing face surface 36 will influence the dimensions of the bracket used with the particular switch. This is so that the bracket can securely support the switch relative to an opening in a motor housing shell or a junction box wall with the actuator extending into the opening but not significantly beyond the opening.

The relative positions of the switch housing face surface 36 and engagement surface 48 to the actuator 44 are important for the proper functioning of the bracket. However, switch housings of slightly different constructions would work equally well with the bracket. For example, it is not necessary that the engagement surface 48 extend completely around the switch housing, nor is it necessary that the face surface 36 of the switch housing be entirely flat or parallel with the engagement surface 48. Therefore, it is possible that the bracket yet to be described may be employed with other types of switch housings that are slightly different from that shown in FIGS. 8 and 9. In addition, it will be readily apparent to those skilled in the art that minor modifications could be made to the bracket to be described to adapt the bracket for use with other types of switches.

Figure 7:
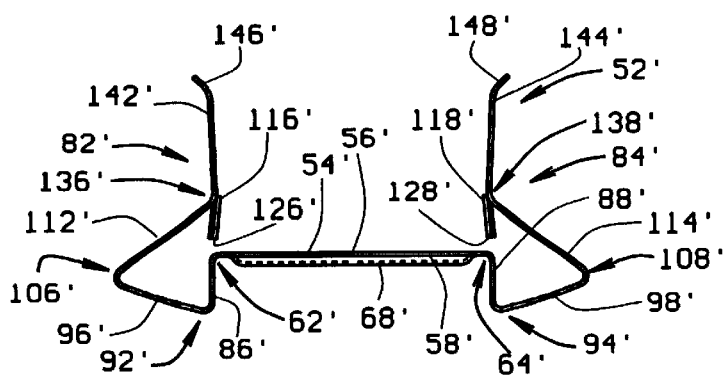
FIG. 7 is an elevation view of a variant embodiment of the switch mounting bracket of FIG. 3 employed in mounting a switch adjacent a curved or cylindrical wall.

A first embodiment of the bracket 52 is shown in FIGS. 3 through 6 and 8. A second embodiment of the bracket 52' is shown in FIGS. 7 and 9. The second embodiment of the bracket 52' is substantially the same as the first embodiment 52 and like reference numbers followed by a prime (') are used to label parts of the second embodiment that correspond to the same numbered parts of the first embodiment. The only difference between the two embodiments will be pointed out when the corresponding part of the first embodiment is described.

In the preferred embodiment, the bracket 52 is formed from a single resilient metal strip. However, the bracket is capable of being constructed of other materials and functioning equally well, for example resilient plastic materials. Where the bracket is constructed of a metal strip, it is provided with several bends formed in the strip that give the bracket a configuration that is capable of holding the switch to the bracket and provides the proper positioning of the switch actuator relative to an opening in a motor shell wall or junction box wall. If the bracket were constructed of other materials, for example plastic, it may be necessary to mold the bracket in the particular configuration shown in the drawings.

The bracket 52 is formed with a generally flat, rectangular support surface section 54 at its middle. The support surface section has opposite top 56 and bottom 58 surfaces. The support surface section 54 is formed with parallel bends 62, 64 at opposite ends of the support surface section. The width of the support surface section 54 between the bends 62, 64 is substantially equal to the diameter dimension of the switch housing face surface 36. A pair of reinforcing troughs 66 are stamped in the top of the support surface 54 forming reinforcing ribs 68 that project from the bottom of the support surface. An opening 72 passes through the center of the support surface 54. The position of the opening 72 is determined by the position of the push button actuator 44 of the particular switch to be employed with the bracket. When the bracket is used with other switches, the opening 72 may not be circular and may be positioned off center or intersecting one of the edges of the bracket support section 54.

A pair of legs 82, 84 are formed in the bracket at the bends 62, 64 at the opposite ends of the support surface section 54. The pair of legs are the same and are mirror images of each other.

Each of the legs is provided with a spacing section 86, 88 that extends downwardly from the bottom 58 of the support surface section 54. The spacing sections 86, 88 are positioned at right angles relative to the support surface section 54 and extend a predetermined distance from the bottom 58 of the support surface section. The predetermined distance is based on the length or the extent to which the push button actuator 44 extends from the face surface 36 of the switch housing. Thus, the distance that the spacing sections 86, 88 extend from the bottom of the support surface section 54 is slightly less than the length of the actuator 44 of the switch with which the bracket is to be used. This will position the distal end of the actuator 44 in an opening of a motor shell wall or junction box wall with which the bracket and switch are to be used. For switches having different length actuators, the length of the spacing sections 86, 88 will have to be adjusted accordingly.

Figure 1:
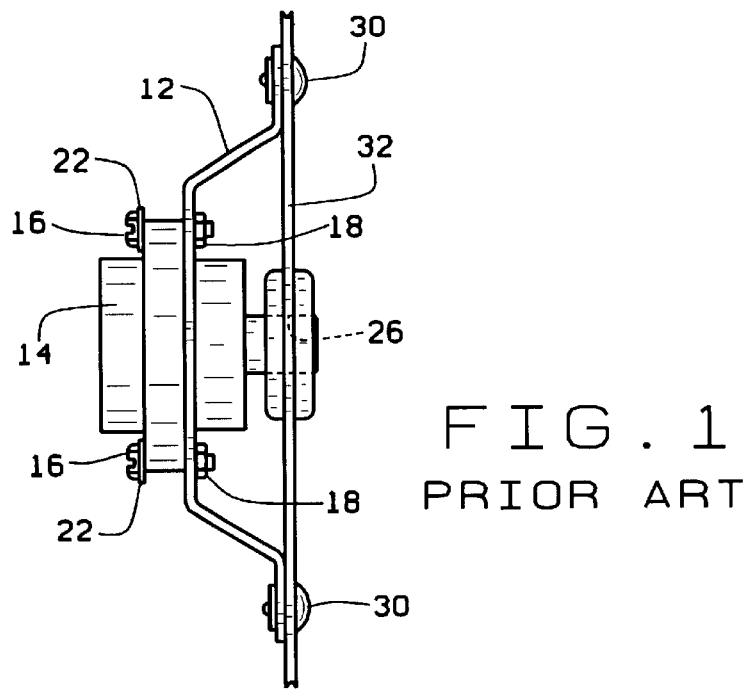
FIG. 1 is a partial side view of a prior art switch mounting bracket supporting a push button switch adjacent an opening in a flat section of wall such as a junction box wall.
Figure 2:
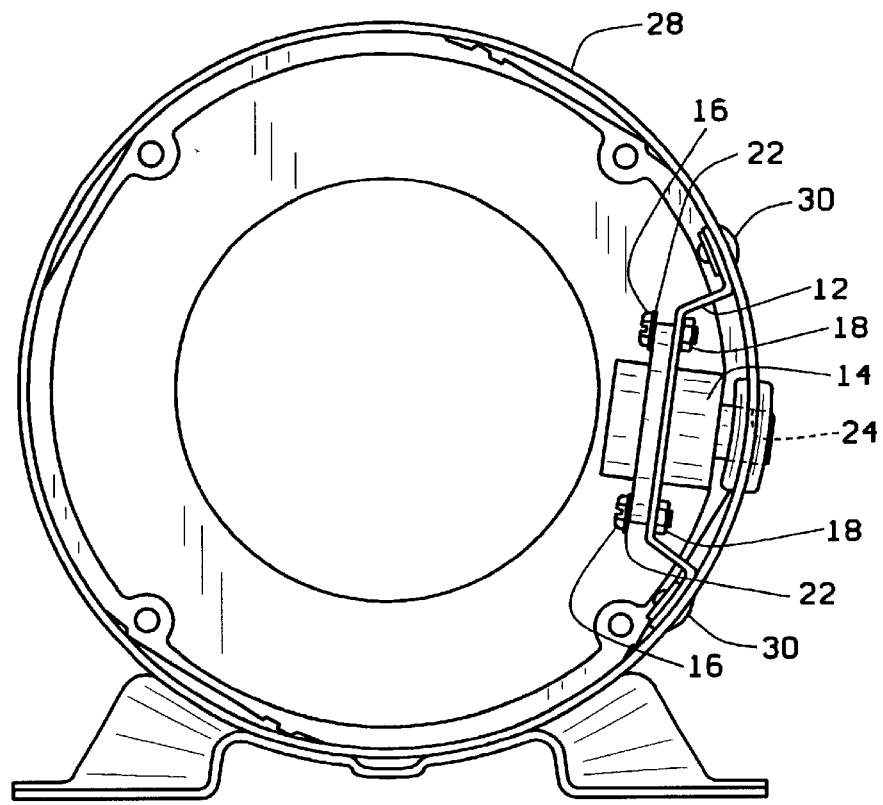
FIG. 2 is an end elevation view of a prior art switch mounting bracket mounting a switch adjacent to an opening in a curved or cylindrical wall of a motor shell housing.
Figure 3:
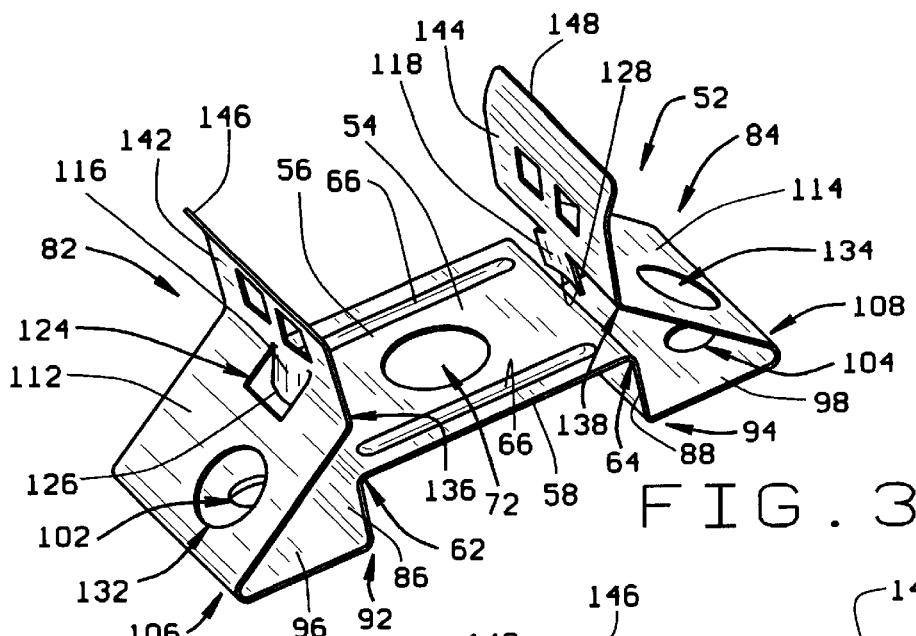
FIG. 3 is a perspective view of the switch mounting bracket of the invention.
Figure 4:
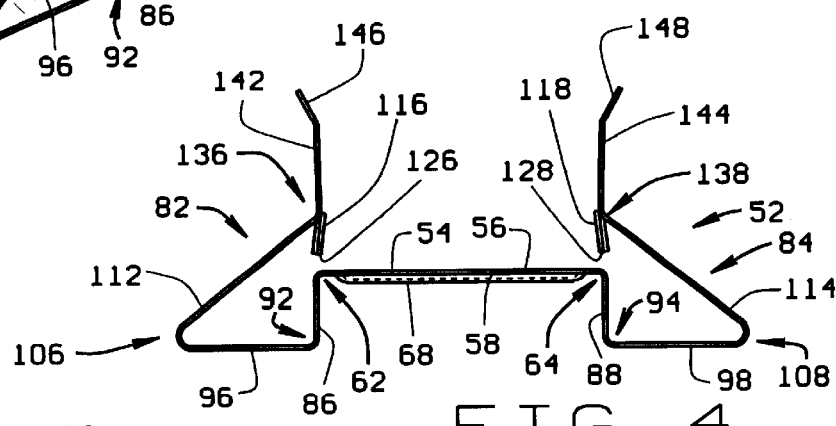
FIG. 4 is an elevation view of the switch mounting bracket of FIG. 3.

A pair of bends 92, 94 are formed in the bottom ends of the spacing sections 86, 88 and a pair of base sections 96, 98 project outwardly from the bends 92, 94. As seen in FIG. 4, the base sections 96, 98 of the bracket extend outwardly away from each other and away from the spacing sections 86, 88. In the embodiment of FIGS. 3–6 and 8, the base sections 96, 98 are positioned in the same plane which is parallel to the plane of the support surface section 54. The bracket base sections 96, 98 are positioned in the same plane when the bracket is to be attached to a flat housing shell wall, an endshield or junction box wall. In this application of the bracket, the base sections 96, 98 engage the flat wall. Each of the bracket base sections 96, 98 is provided with a fastener hole 102, 104. The fastener holes 102, 104 are employed in attaching the bracket to a motor shell wall, an endshield or junction box wall as will be explained.

When the bracket is to be attached to a cylindrical motor shell wall or other type of curved wall such as that shown in FIG. 9, then the base sections of the bracket legs are formed at a slight angle that follows the curvature of a concave surface of the wall as shown in FIG. 7. This change in the relative positions of the leg base sections is the only significant difference between the embodiment of FIGS. 3–6 an 8, and the embodiment of FIGS. 7 and 9.

Figure 5:
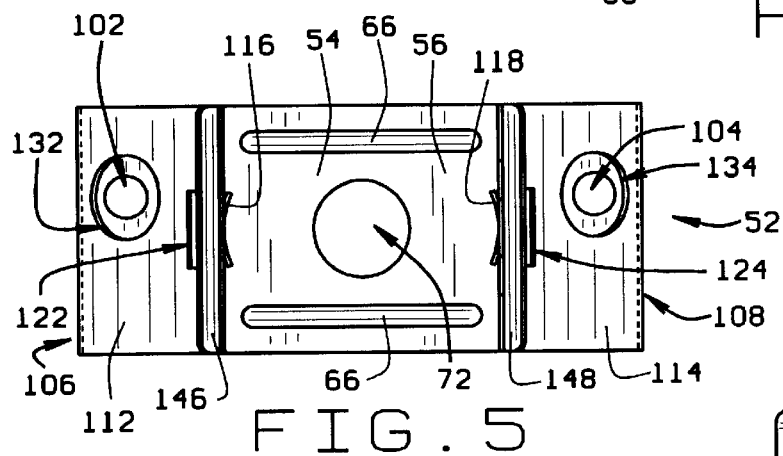
FIG. 5 is a top plan view of the switch mounting bracket of FIG. 3.
Figure 6:
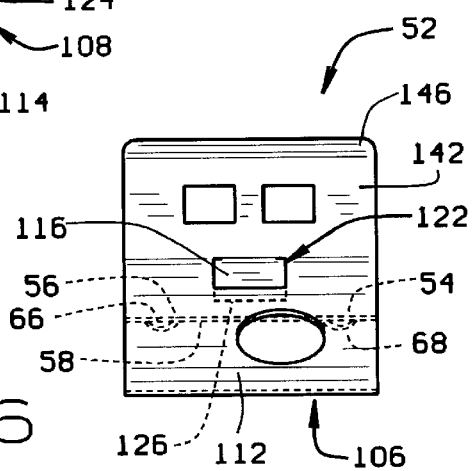
FIG. 6 is a side elevation view of the switch mounting bracket of FIG. 3.

Spring bends 106, 108 are formed in the bracket at the opposite ends of the base sections 96, 98 connecting the base sections 96, 98 to spring sections 112, 114 of the bracket. As seen in FIG. 4, the spring bends 106, 108 are positioned relative to the bracket base sections 96, 98 at less than 90° angles. The spring bends 106, 108 enable the spring sections 112, 114 of the bracket to be resiliently flexed away from each other and away from the support surface section 54 and the base sections 96, 98 of the bracket. The resilience of the bracket, and in particular the resilience of the spring bends 106, 108, will cause the spring sections 112, 114 to return to their positions relative to the support surface section 54 and the base sections 96, 98 shown in FIG. 4 when the external force that flexed the spring sections 112, 114 away from their positions shown in FIG. 4 is removed. The spring sections 112, 114 extend from the spring bends 106, 108 to positions adjacent the bends 62, 64 at the opposite ends of the support surface section 54 where a pair of tabs 116, 118 are formed in the spring sections. The tabs 126, 128 are formed in the spring sections 112, 114 by cutting generally U-shaped slots 122, 124 in the spring sections. The pair of tabs 116, 118 are bent inwardly toward each other out of the U-shaped slots 122, 124 to the extent that bottom edges 116, 118 of the tabs are positioned just above the bends 62, 64 at the opposite ends of the bracket support surface section 54. In the particular embodiment where the bracket is to be used with a switch housing having a cylindrical surface 34, the tabs 126, 128 are each given a curvature that matches that of the exterior of the switch housing 34 so that the tabs will engage around portions of the switch housing when in use. A pair of access openings 132, 134 pass through the spring sections 112, 114 in positions directly above the fastener holes 102, 104 in the bracket base sections 96, 98. As seen in FIG. 5, the access openings 132, 134 are slightly larger than the fastener holes 102, 104. The access openings 132, 134 provide access to fasteners employed in attaching the bracket base sections 96, 98 to a separate surface.

A pair of bends 136, 138 are formed in the tab ends of the spring sections 112, 114 connecting the spring sections to a pair of flanges 142, 144. The flanges 142, 144 extend upwardly from the spring sections 112, 114. The flanges 142, 144 have outwardly turned ears 146, 148 at their top ends. The ears 146, 148 provide easy access to the distal ends of the flanges by a person's fingers so that the flanges may be moved away from each other against the resilience of the spring bends 106, 108 and the spring sections 112, 114 in inserting a switch housing between the flanges and in removing a switch from the bracket.

The use of both embodiments of the bracket is the same and only the bracket of FIGS. 3–6 and 8 will be described. The bracket 52 is first mounted to the interior surface of a motor housing shell or a junction box 162. In mounting the bracket, the opening 72 in the bracket support surface is aligned with an opening 164 through the wall of the motor shell or junction box provided to accommodate the actuator 44 of the switch. The base sections 96, 98 of the legs are then secured against the interior surface 162 of the motor shell, endshield or junction box by fasteners 166, 168 such as screws, nuts, pop rivets, weldments or other equivalent types of fasteners.

With the bracket 52 secured to the interior surface 162 of the motor shell, endshield or junction box, the ears 146, 148 at the ends of the leg flanges are then manually moved away from each other against the bias of the leg spring sections 112, 114 and spring bends 106, 108. This expands a spacing between the pair of flanges 142, 144 and causes the tabs 116, 118 and, in particular, the tab edges 126, 128 to move a slight distance away from the support surface 54 of the bracket.

The switch housing 34 is then inserted between the flanges 142, 144 as the assembler continues to hold the flanges in their displaced positions against the bias of the leg spring bends 106, 108 and spring sections 112, 114. The switch housing 34 is positioned so that the switch actuator 44 passes through the support surface opening 72 and into the opening 164 of the motor shell wall, endshield or junction box wall, and so that the face surface 36 of the switch housing is positioned flush against the bracket support surface 54. With the switch housing so positioned, the assembler then releases the ears 146, 148 of the leg flanges. The resilience of the leg spring sections and spring bends then moves the flanges toward each other and toward the opposite sides of the switch housing and causes the tab edges 126, 128 to engage against the engagement surface 48 of the switch housing collar. The resilience of the leg spring sections 112, 114 and spring bends 106, 108 and the engagement of the tab edges 126, 128 against the engagement surface 48 of the switch housing holds the switch housing securely to the bracket with the face surface 36 of the switch housing flush against the support surface 54 of the bracket. The resilience of the leg spring sections and engagement of the tab edges against the engagement surface of the switch housing alone holds the switch housing to the bracket and no additional fasteners are needed.

The construction of the switch mounting bracket and. the particular switch housing with which it is intended for use provides an inexpensively manufactured switch mounting bracket. The bracket reduces the expense involved in assembling a switch to the bracket by removing the need for separate fasteners to hold the switch housing to the bracket. This also removes the expense of assembly time that would be needed in prior art switch mounting brackets that require separate fasteners for holding the switch housing to the bracket.

While the present invention has been described by reference to a specific embodiment, it should be understood that modifications and variations of the invention may be constructed without departing from the scope of the invention defined in the following claims. For example, a variation of the bracket could be designed to be slip fit (without fasteners) into a specific junction/conduit box such as that disclosed in U.S. Pat. No. 5,791,456. Variations of the bracket could be designed to accept round 1¼" protector/switches, both single phase and three (3) phase, complying with U.L. electrical clearances between the protector/switch contacts and the bracket legs, or with bracket legs designed to accept ¾" and 1" eared protector/switches, both single and three (3) phase.

What is claimed:

1. An apparatus for supporting a switch, the apparatus comprising:

a switch housing containing a switch, the switch housing having an external face surface and an external engagement surface that is spaced from the face surface, and the switch having an actuator that projects from the switch housing face surface;

a bracket having a support surface in contacting engagement with the switch housing face surface, the support surface having an opening and the switch actuator extends into the opening, and the bracket having a resilient leg extending from the support surface, the leg having an edge engaging with the switch housing engagement surface to secure the bracket against the face surface of the switch housing.

2. The apparatus of claim 1, wherein:
the resilience of the leg biases the edge of the leg toward the bracket support surface.

3. The apparatus of claim 1, wherein:
the resilience of the leg biases the edge of the leg into engagement with the switch housing engagement surface.

4. The apparatus of claim 1, wherein:
the bracket leg has an opening for receiving a fastener in attaching the leg to a separate surface, and a configuration of the leg spaces the bracket support surface from the separate surface when the leg is attached to the separate surface.

5. The apparatus of claim 1, wherein:
the switch housing face surface and the switch housing engagement surface are parallel to each other.

6. The apparatus of claim 1, wherein:
the switch housing engagement surface extends completely around the switch housing.

7. The apparatus of claim 1, wherein:
the switch housing is cylindrical, the face surface is circular and the engagement surface is annular.

8. The apparatus of claim 1, wherein:
the bracket support surface, the leg and the edge are all formed in a single metal strip.

9. The apparatus of claim 8, wherein:
the edge is on a tab formed in the strip by a generally U-shaped slot in the strip.

10. The apparatus of claim 1, wherein:
the bracket leg is one of at least a pair of like bracket legs that extend from opposite sides of the bracket support surface, and the pair of legs position their pair of edges on opposite sides of the support surface where the pair of edges engage the switch housing engagement surface.

11. The apparatus of claim 10, wherein:
each bracket leg has a tab projecting from the bracket leg and each edge is on an end of a tab.

12. The apparatus of claim 11, wherein:
the switch housing is positioned between the pair of legs.

13. The apparatus of claim 11, wherein:
the bracket support surface, the pair of legs and the pair of tabs are all formed in a single metal strip.

14. The apparatus of claim 10, wherein:
the switch housing face surface is held against the bracket support surface solely by the pair of edges of the pair of legs engaging with the switch housing engagement surface.

15. An apparatus for supporting a switch, the apparatus comprising: a switch housing containing a switch, the switch housing having a face surface with a switch actuator projecting therefrom and an engagement surface that is spaced from the face surface;
a bracket having a support surface with an opening, the switch housing face surface is positioned flush against the support surface and the switch actuator extends into the support surface opening, and the bracket having a resilient leg extending from the support surface, the leg having an edge engaging with the switch housing engagement surface to secure the bracket against the face surface of the switch housing.

16. The apparatus of claim 15, wherein:
the bracket leg is one of at least a pair of resilient legs that extend from the support surface and each of the bracket legs has an edge engaging with the switch housing engagement surface.

17. The apparatus of claim 16, wherein:
the bracket support surface, the legs and the edges are all formed in a single strip of material.

18. The apparatus of claim 16, wherein:
the switch housing face surface is held flush against the bracket support surface solely by the edges engaging with the switch housing engagement surface.

* * * * *